(12) United States Patent
John et al.

(10) Patent No.: US 10,924,120 B1
(45) Date of Patent: Feb. 16, 2021

(54) FINE GRANULARITY IN CLOCK GENERATION

(71) Applicant: Advanced Micro Devices, Inc., Santa Clara, CA (US)

(72) Inventors: Deepesh John, Austin, TX (US); Samiul Haque Khan, Austin, TX (US); Vibhor Mittal, Austin, TX (US); Shravan Lakshman, Austin, TX (US); Teja Singh, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/696,285

(22) Filed: Nov. 26, 2019

(51) Int. Cl.

| | | |
|---|---|---|
| H03K 5/04 | (2006.01) | |
| H03K 5/06 | (2006.01) | |
| H03K 5/156 | (2006.01) | |
| H03K 7/08 | (2006.01) | |
| H03L 7/081 | (2006.01) | |
| H03L 7/099 | (2006.01) | |
| H03K 19/20 | (2006.01) | |

(52) U.S. Cl.
CPC ........... *H03L 7/081* (2013.01); *H03K 5/1565* (2013.01); *H03L 7/099* (2013.01); *H03K 19/20* (2013.01)

(58) Field of Classification Search
CPC ...... H03K 5/1565; H03K 19/20; H03L 7/081; H03L 7/099
See application file for complete search history.

(56) References Cited

U.S. PATENT DOCUMENTS

| | | | | |
|---|---|---|---|---|
| 6,566,918 B1 * | 5/2003 | Nguyen | ................... | G06F 1/08 327/115 |
| 6,886,106 B2 * | 4/2005 | Brock | ...................... | G06F 1/08 327/175 |

\* cited by examiner

*Primary Examiner* — Kenneth B Wells
(74) *Attorney, Agent, or Firm* — Polansky & Associates, P.L.L.C.; Paul J. Polansky; Nathan H. Calvert

(57) ABSTRACT

An oscillator circuit includes a phase-locked loop (PLL) with a plurality of voltage controlled oscillator (VCO), a clock divider circuit receiving the VCO phase outputs and outputting a first stage clock signal with an adjustable clock period related to the PLL period based on selecting a combination of two of the VCO phase outputs. The first stage clock signal has a balanced duty cycle at frequencies that are related to the PLL frequency by even fractional divisions of the VCO phase output period based on the quantity VCO phase outputs, and an unbalanced duty cycle at frequencies that are related by odd fractional divisions. A duty cycle adjustment (DCA) circuit receives the first stage clock signal selectively adjusts a falling edge of the first stage clock signal to provide an even duty cycle and feeds a resulting signal to the second stage clock signal output.

19 Claims, 6 Drawing Sheets

FINE GRANULARITY IN CLOCK GENERATION

BACKGROUND

Integrated circuits (ICs) often include a large number of data subsystems fabricated on a single semiconductor die. For example, an IC microprocessor device can include a memory interface subsystem and a graphics acceleration subsystem in addition to a central processing unit. The various subsystems often operate with different clock frequencies, many of which are adjustable to control power consumption, requiring a variety of different clock frequencies to be supplied. This variety typically requires oscillator circuits that can supply multiple different frequencies.

One such oscillator circuit is a digital frequency synthesizer (DFS), which produces digitally controlled output frequencies based on a single phased-locked loop (PLL) oscillator. One type of DFS employs a voltage controlled oscillator (VCO) PLL with a number of phase outputs. Each phase output represents the output of the VCO with a different phase delay. Using these phase outputs, a clock divider circuit is able to produce clock signals at selectable clock periods that are designated fractions of the VCO's clock period, such as 10/8 or 12/8. However, the granularity of such circuits, or the ability to provide a desired period and the associated clock frequency at a desired increment, is limited due to limitations of the clock divider. While granularity may be improved by providing more phase outputs from the VCO, such solutions have difficulties in meeting timing specifications, and are costly in terms of circuit area and power consumption.

Figure 1:
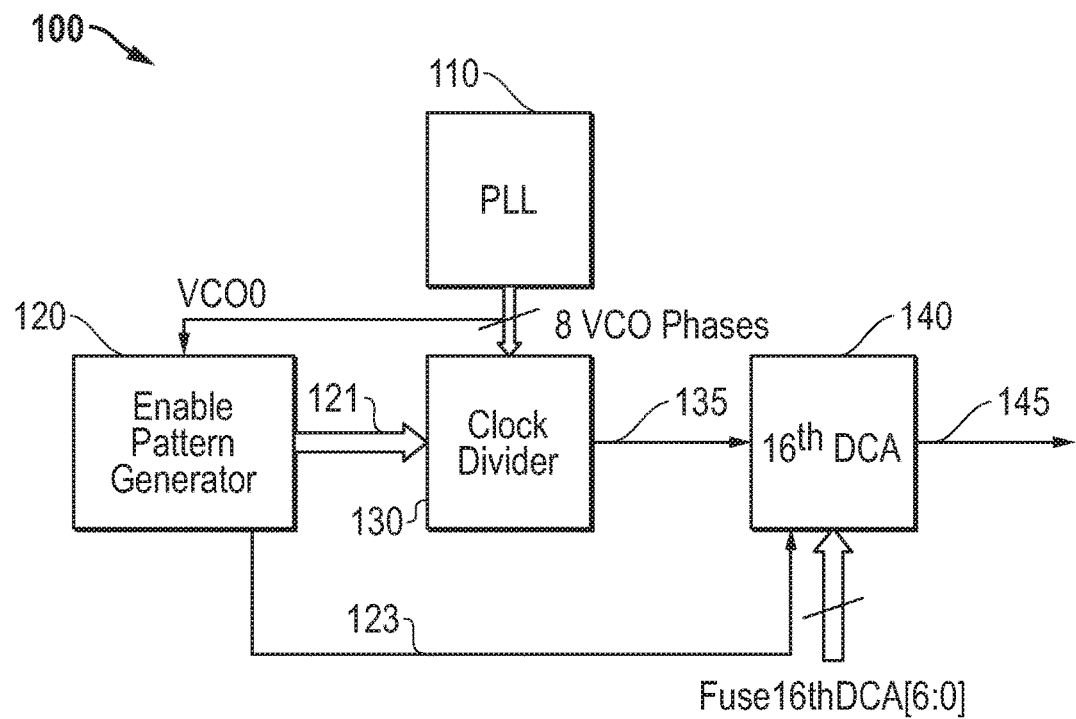
FIG. 1 illustrates in block diagram form an oscillator circuit according to some embodiments.

In the following description, the use of the same reference numbers in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Also, various components are referred to as "optics" or "optical", but it is to be understood that these names do not imply that the electromagnetic signals are necessarily within the visible range.

DETAILED DESCRIPTION OF ILLUSTRATIVE EMBODIMENTS

An oscillator circuit includes a phase locked loop (PLL), a clock divider circuit, an enable pattern generator, and a duty cycle adjustment (DCA) circuit. The PLL has a PLL frequency and plurality of voltage controlled oscillator (VCO) phase outputs. The clock divider circuit receives the VCO phase outputs from the PLL and produces a first stage clock signal at an adjustable frequency related to the PLL frequency and based on selecting a combination of multiple selected VCO phase outputs, the first stage clock signal having a balanced duty cycle at frequencies that are related to the PLL frequency by even fractional divisions of a VCO phase output period based on the quantity of VCO phase outputs, and an unbalanced duty cycle at frequencies that related by odd fractional divisions. The enable pattern generator produces a control signal fed to the clock divider circuit and an enable signal indicating an odd fractional division of the VCO phase output period is desired. The DCA circuit receives the first stage clock signal and the enable signal. In response to absence of the enable signal, the DCA circuit operates in a first mode which reproduces the first stage clock signal at a second stage clock signal output, and, in response to presence of the enable signal, operates in a second mode which adjusts a falling edge of the first stage clock signal to provide an even duty cycle and feeds a resulting signal to the second stage clock signal output.

A method provides a plurality of VCO phase signals from a PLL operating at a PLL frequency. Based on a control signal, a combination of multiple selected VCO phase signals are selected. Based on the selected VCO phase signals, the method produces a first stage clock signal at an adjustable frequency related to the PLL frequency. The first stage clock signal has a balanced duty cycle at frequencies that are related to the PLL frequency by even fractional divisions of a VCO phase output period based on the quantity of VCO phase outputs, and an unbalanced duty cycle at frequencies that related by odd fractional divisions. The method produces an enable signal indicating when an odd fractional division of the VCO phase output period is desired for the adjustable frequency. In response to absence of the enable signal, the first stage clock signal is reproduced at a second stage clock signal output. In response to presence of the enable signal, a falling edge of the first stage clock signal is adjusted to provide an even duty cycle and feeding a resulting signal to the second stage clock signal output.

A duty cycle adjustment (DCA) circuit for use with an adjustable oscillator has a first stage clock signal input, an enable signal input, a second stage clock signal output, and a timing adjustment circuit. The first stage clock signal input is operable for receiving first stage clock signal at an adjustable frequency, the first stage clock signal having a balanced duty cycle at frequencies in a first group of selected frequencies, and an unbalanced duty cycle at frequencies in a second group of selected frequencies. The enable signal input is operable for receiving an enable signal indicating when the first stage clock signal has an unbalanced duty cycle. The timing adjustment circuit, in response to absence of the enable signal, operates in a first mode which reproduces the first stage clock signal at the second stage clock signal output, and, in response to presence of the enable signal, operates in a second mode which adjusts a falling edge of the first stage clock signal to provide an even duty cycle and feeds a resulting signal to the second stage clock signal output.

FIG. 1 illustrates in block diagram form an oscillator circuit 100 according to some embodiments. Oscillator circuit 100 a phase-locked loop (PLL) 110, an enable pattern generator 120, a clock divider 130, and a duty cycle adjustment (DCA) circuit 140.

PLL 110 produces eight voltage controlled oscillator (VCO) phase outputs. Typically the eight phases are evenly distributed across a single cycle. Clock divider 130 receives the VCO phase outputs from PLL 110 and outputs a first stage clock signal 135 at an adjustable frequency related to the PLL frequency. The adjustable frequency is controlled by an eight-bit control signal 121 produced by an enable pattern generator 120 and fed to clock divider 130. The adjustable frequency is based on selecting a combination of multiple VCO phase outputs. The VCO phase outputs are used in combination to provide the rising and falling edges for the first stage clock signal in a sequence. A single pair of VCO phase outputs may be selected, or multiple pairs may be selected. Due to the operation of clock divider 130, first stage clock signal 135 has a balanced duty cycle at frequencies that are related to the PLL frequency by even fractional divisions based on the number of VCO phase outputs, and an unbalanced duty cycle at frequencies that related by odd fractional divisions, as further described below. In this example, clock divider 130 is able to produce a balanced duty cycle at even $1/8^{th}$ fractions of the PLL clock period such as 8/8, 10/8, and 12/8. The denominator of 8 comes from the number of phase outputs, while the numerator sets the desired period as a fraction of the VCO phase output period (the period of the PLL). However, divisions that provide a finer $1/16^{th}$ resolution for first stage clock signal 135 produce an unbalanced duty cycle, for example, 9/8 and 11/8.

To correct the cases in which an unbalanced duty cycle is present, enable pattern generator 120 produces an enable signal 123, labelled "16thDCAEn", which indicates when an odd fractional division of the PLL frequency is desired. Enable pattern generator also receives the first phase output from PLL 110, labeled "VCO0", in order to properly time enable signal 123. Enable signal 123 is fed to DCA circuit 140 to enable a duty cycle adjustment. DCA circuit 140 receives first stage clock signal 135 and enable signal 123. In response to absence of enable signal 123, DCA circuit 140 operates in a first mode which reproduces first stage clock signal 135 as a second stage clock signal 145. In response to presence of the enable signal 123, DCA circuit 140 operates in a second mode which adjusts a falling edge of first stage clock signal 135 to provide an even duty cycle, and outputs the resulting signal as the second stage clock signal 145, as further described below. A delay of DCA circuit 140 is programmable with a DCA adjustment signal, labelled "Fuse16thDCA[6:0]", as further with respect to FIG. 2 and FIG. 5.

While eight VCO phase outputs are employed in this embodiment, other embodiments use more or fewer VCO phase outputs. In this embodiment, PLL 110 has an adjustable frequency in a range of up to about 4 GHz. The PLL frequency varies according to the particular application.

Figure 2:
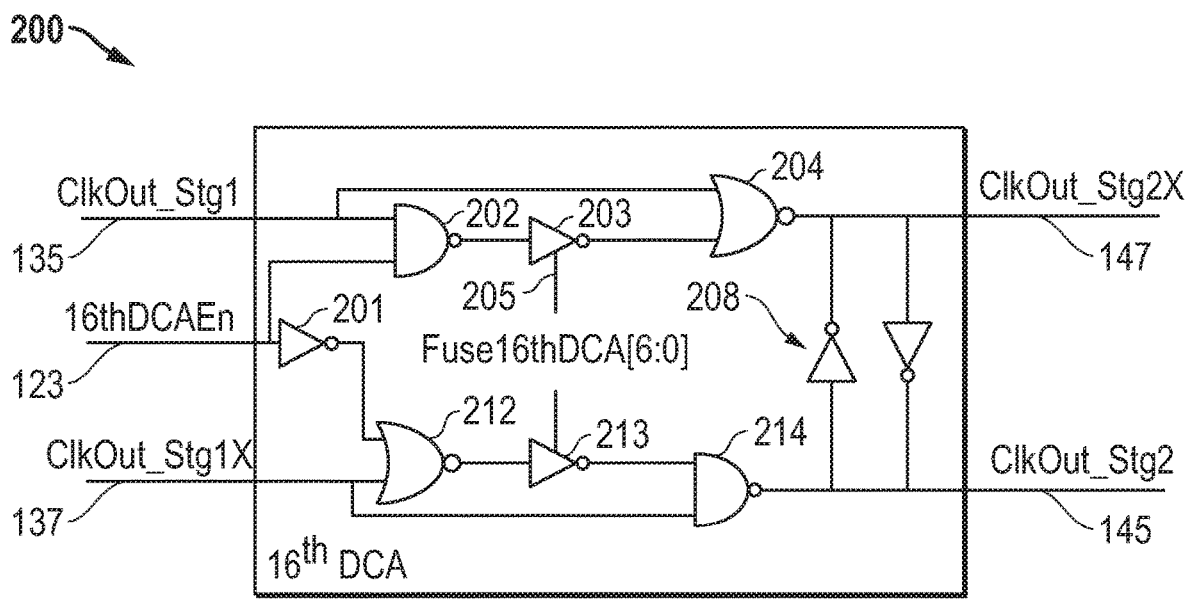
FIG. 2 shows in circuit diagram form a duty cycle adjustment (DCA) circuit according to some embodiments.

FIG. 2 shows in circuit diagram form a duty cycle adjustment (DCA) circuit 200 according to some embodiments. DCA circuit 200 is suitable for use in oscillator circuit 100 of FIG. 1 and other suitable oscillator circuits. Three input terminals receive first stage clock signal 135, enable signal 123, and an inverted first stage clock signal 137. First stage clock signal 135, labelled "ClkOut_Stg1", is fed to an input of a NAND gate 202 and an input of a NOR gate 204. NAND gate 202 also receives enable signal 123. The output of NAND gate 202 is connected to an inverter 203, which includes multiple programmable branches as further described below. The output of inverter 203 is connected to an input of NOR gate 204.

In operation, when enable signal 123 is at a logical LOW, meaning the duty cycle adjustment function is not enabled, DCA circuit 200 operates in the first mode in which NOR gate 204 reproduces first stage clock signal 135 in an inverted form, labelled "ClkOut_Stg2X", at an second stage clock output 147. In the first mode, the output of NAND gate 202 is held HIGH because enable signal 123 is LOW. The output of inverter 203 is held HIGH, causing NOR gate 204 to be controlled by first stage clock signal 135. When enable signal 123 is high, meaning the duty cycle adjustment is enabled, DCA circuit 200 operates in the second mode which adjusts a falling edge of first stage clock signal 135 to provide an even duty cycle in the signal at second stage clock output 147. In the second mode, the rising edge of first stage clock signal 135 controls the falling edge at the output of NOR gate 204 without added delay beyond the gate delay of NOR gate 204. The effect of the falling edge is first stage clock signal 135 is delayed by NAND gate 202 and inverter 203. Inverter 203 includes a number of programmable branches that adjust the speed of the inverter response, providing an adjustable phase delay which balances the duty cycle of the inverted second stage clock signal at second stage clock output 147.

The lower depicted branch of the circuit operates to produce the second stage clock signal 145, labelled "ClkOut_Stg2". Enable signal 123 is fed to an inverter 201, the output of which is connected to an input of NOR gate 212. The other input of NOR gate 212 receives an inverted first stage clock signal 137, labelled "ClkOut_Stg1X". The output of NOR gate 212 is connected to an inverter 213, which includes multiple programmable branches to adjust the timing of the rising edge of its output. The output of inverter 213 is connected to an input of a NAND gate 214, with another input of NAND gate 214 receiving the inverted first stage clock signal 137. The output of NAND gate 214 provides second stage clock signal 145. In the first mode of operation, inverted first stage clock signal 137 controls the output of NAND gate 214 to reproduce the first stage clock signal 135 as second stage clock signal 145. When the enable signal is high, indicating the duty cycle adjustment is enabled, the falling edge of the output of NAND gate 214 is controlled by the output of inverter 213, which provides a phase delay like that of inverter 203.

The phase delay of inverters 203 and 213 is programmable according to DCA signal 205, labelled "Fuse16thDCA[6:0]". In this embodiment, DCA signal 205 is a 7-bit signal provided from a bank of fuses which are burned to set the delay of inverters 203 and 213, as further described below. Typically the programming is the same on both inverters 203 and 213, however in some embodiments different programming may be used.

Figure 3:
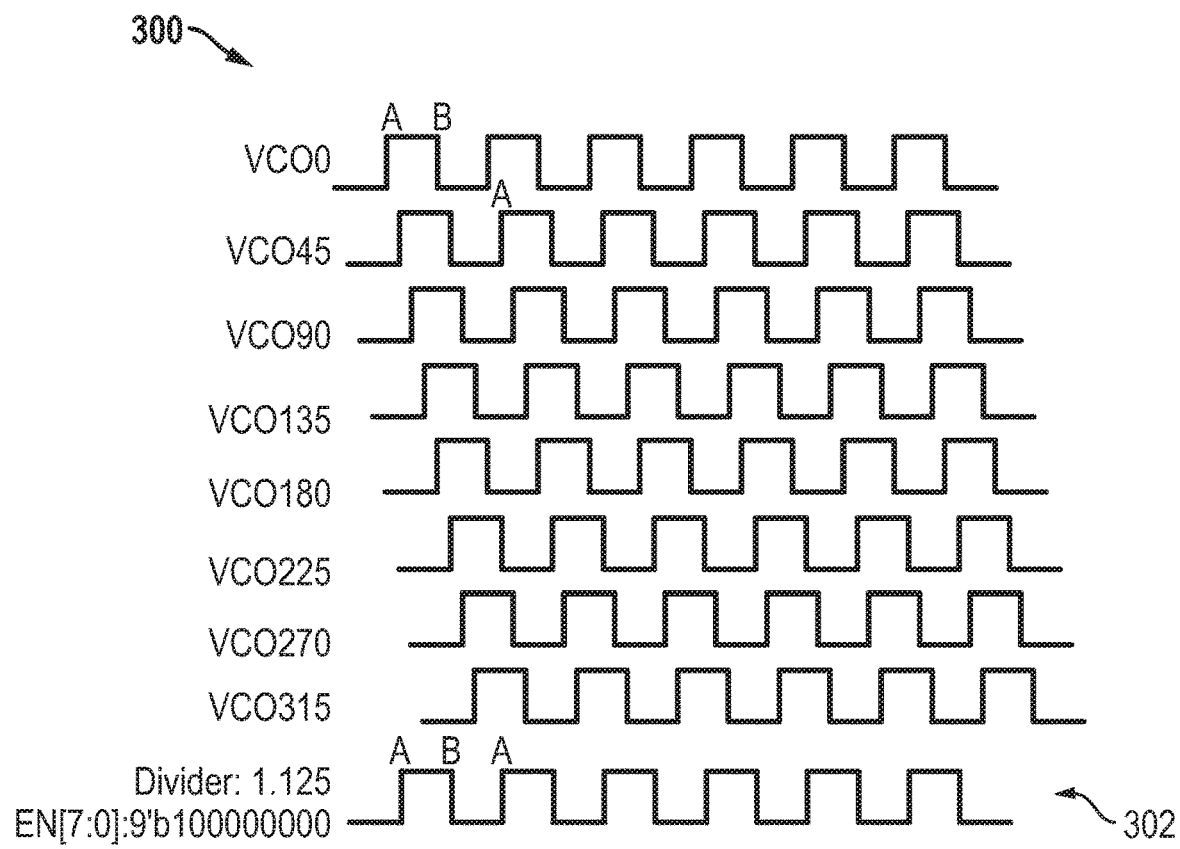
FIG. 3 shows in timing diagram form a set of phase outputs along with an example first stage clock signal illustrating operation at a frequency division of 9/8.

FIG. 3 shows in timing diagram form a set of phase outputs 300 along with an example first stage clock signal 302 illustrating a frequency division of 9/8. Eight phase outputs 300 are shown along with their phase offset in degrees labeled at the left side of the diagram. For example, VCO0 is the first phase output at zero degrees offset, and VCO45 is the second phase output offset at 45 degrees or 360/8. Phase outputs 300 are evenly spaced across an entire clock cycle of 360 degrees of phase.

First stage clock signal 302 illustrates a clock divider output at 9/8 of the PLL frequency's duty cycle. Clock divider 130 (FIG. 1) produces this output based on and selecting a combination of two of the VCO phase outputs for this clock cycle, as illustrated by the two rising edge signals marked "A" and the falling edge signal marked "B." When producing first stage clock signal 302, clock divider 130 does not have a falling edge signal available in the set of phase outputs to properly divide the duty cycle of first stage clock signal 302 at a 50% duty cycle. Instead, the closest to a balanced duty cycle that can be produced employs the falling edge labeled "B", which provides an uneven duty cycle having a high time at 4/8 of the PLL frequency duty cycle and a low time of 5/8 of the PLL frequency duty cycle.

Figure 4:
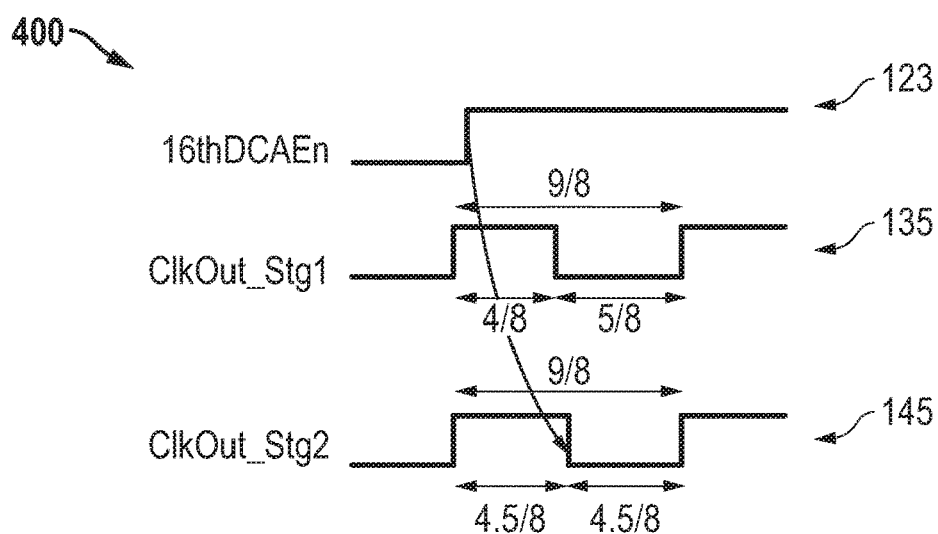
FIG. 4 illustrates in timing diagram form a set of waveforms showing the effect of a duty cycle adjustment performed on the first stage clock signal of FIG. 3 according to some embodiments.

FIG. 4 illustrates in timing diagram form a set of waveforms showing the effect of a duty cycle adjustment performed on the first stage clock signal of FIG. 3 according to some embodiments. Timing diagram 400 shows enable signal 123, first stage clock signal 135, and second stage clock signal 145 over a clock cycle period. As labeled on the diagram, first stage clock signal 135, produced by frequency division, has an unbalanced duty cycle at a ratio of 4/8 to 5/8. Second stage clock signal 145, produced by DCA circuit 140 (FIG. 1), has a balanced duty cycle at a ratio of 4.5/8 to 4.5/8. To enable DCA circuit 140 at the proper time in the clock cycle to activate the circuit branches which add the delay to the falling edge, enable signal 123 is activated at a time after a previous falling edge of the first stage clock signal and before a falling edge adjustment is required. This can be seen in diagram 400 where enable signal 123 goes HIGH slightly after first stage clock signal 135. This timing is preferably accomplished by a timing circuit in enable pattern generator 120.

Figure 5:
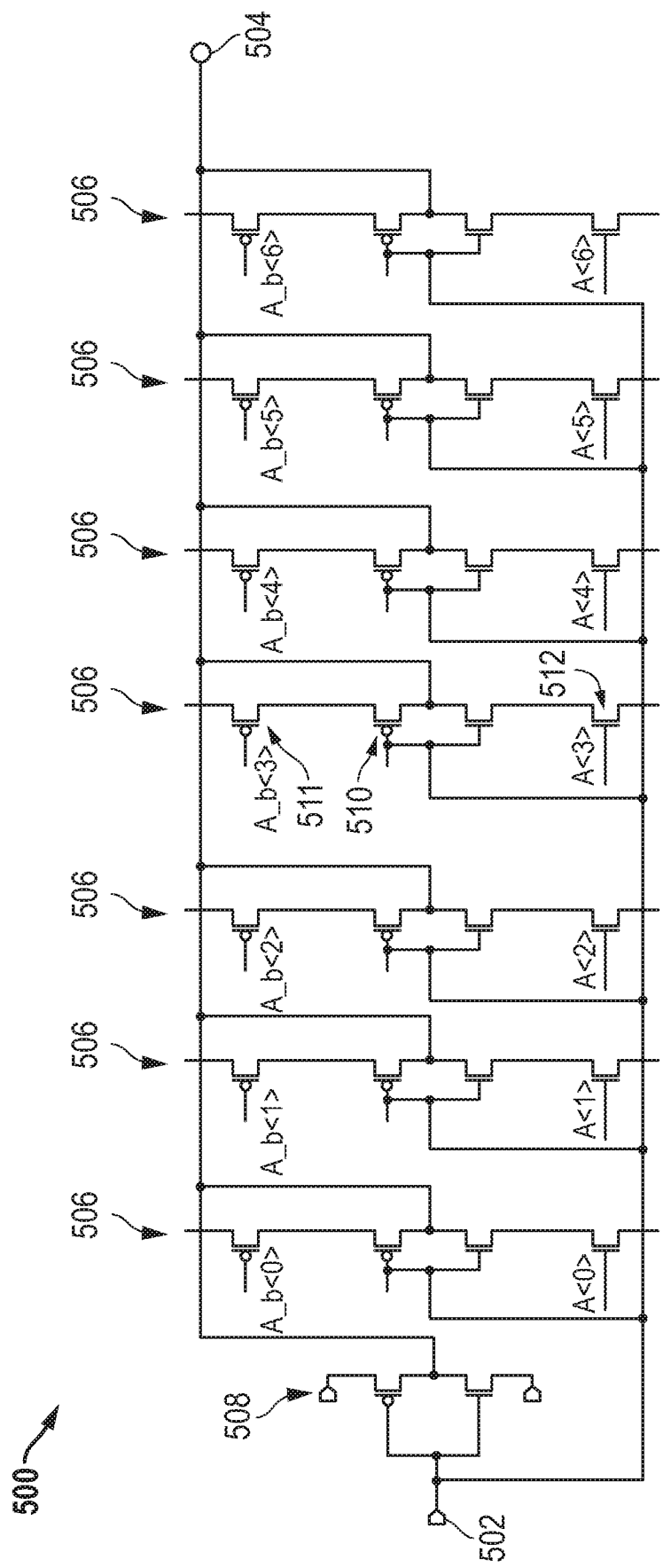
FIG. 5 illustrates in circuit diagram form an inverter used in implementing a clock divider according to some embodiments.

FIG. 5 shows in circuit diagram form an inverter 500 used in implementing inverters 203 and 213 (FIG. 2) according to some embodiments. Inverter 500 has an input terminal 502, and output terminal 504, and a programmable delay circuit with a plurality of branches 506 which are programmable to adjust a phase delay of a change in the input signal causing a change in the output signal. In some embodiments, inverter 500 includes branches that are not programmable, such as an inverter branch 508, which is connected between voltage supplies VDD and VSS. Input terminal 502 is connected to the gate terminals of a P-channel transistor and an N-channel transistor in inverter branch 508, and connected in parallel to the gate terminals of each of a pair of central transistors in each branch 506.

Each of the seven branches 506 includes a pair of central transistors 510 functioning as inverters, with a central output node between the central transistors 510 connected to output terminal 504. Each of the seven branches 506 also includes a header transistor 511 and a footer transistor 512 selectively connecting the central transistors 510 to the voltage supply rails, Header transistors 511 and footer transistors 512 when turned ON activate their respective branch 506, connecting it in parallel to the other connected branches, thereby adjusting the speed of inverter 500. The gates of the header transistors 511 and footer transistors 512 are connected to respective bits of DCA signal 205 (FIG. 2) for activating the branches 506. Preferably, the bits of DCA signal 205 are configured by burning fuses on the host circuit to set the number of branches that are enabled and disabled.

The delay of inverter 500 is measured or characterized and, based on the results, the delay of inverter 500 is adjusted by programming branches 506 to achieve a desired phase delay through DCA circuit 140 for a target clock frequency. In some embodiments, the programming process includes measuring a characteristic of transistor devices within the branches 506, either directly or indirectly, selecting one or more branches 506 to be enabled or disabled, and programming selected branches 506 of the DCA circuit to achieve a desired phase delay. In some embodiments, the measurement or characterization is done by batch or other production groups, and so it is not necessary to measure every individual semiconductor device in the production group. In various embodiment, the branches 506 are programmed with respective fuses which disable or enable respective branches. The programming is preferably done with fuses as described above, programmed during production test. In other embodiments, the programming is accomplished with dynamic settings to produce DCA signal 205. Some of those embodiments use a feedback loop to measure the duty cycle of second stage clock signal 145 and adjust the number of activate branches 506 accordingly to achieve a desired inverter delay and duty cycle.

Figure 6:
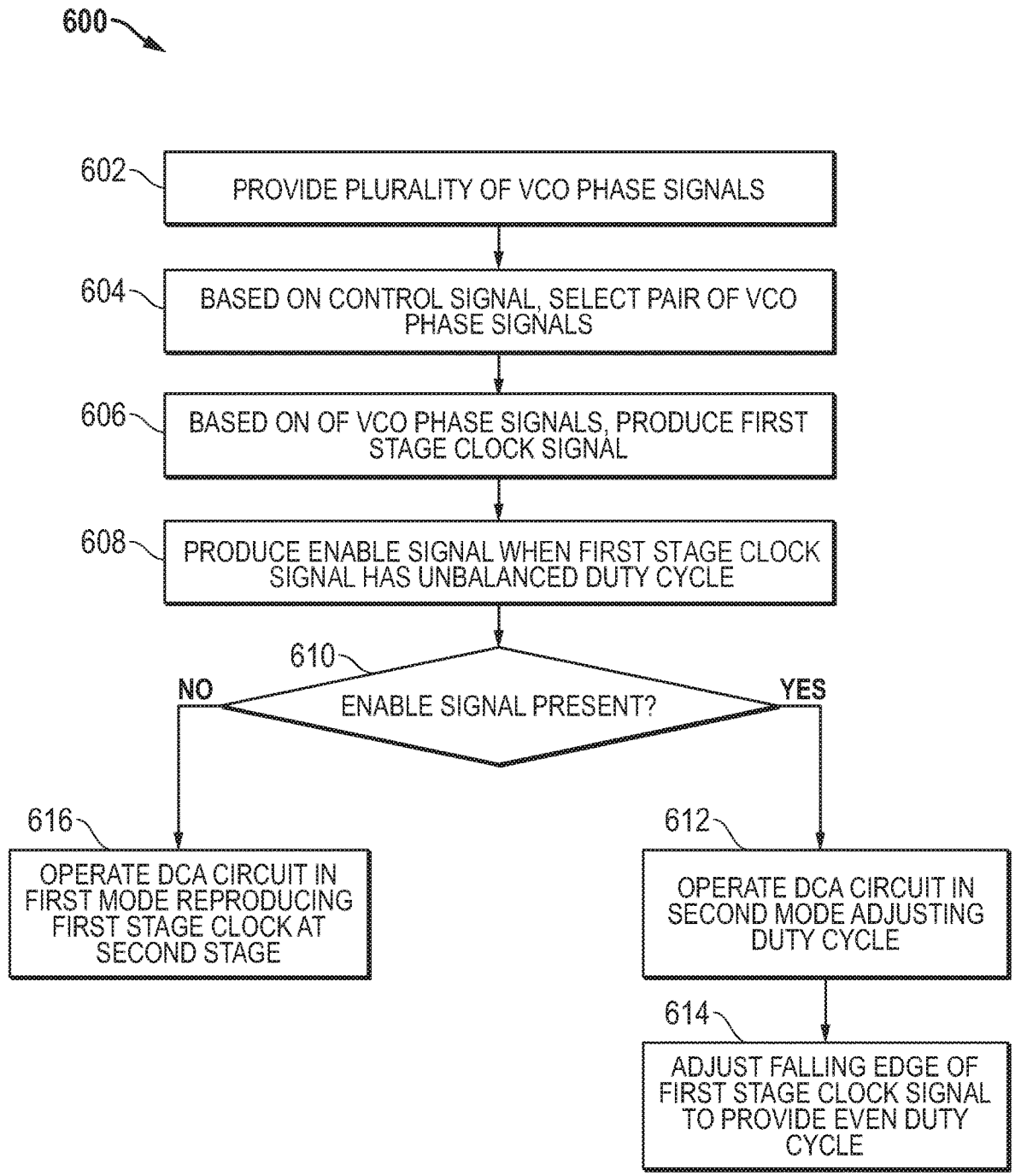
FIG. 6 illustrates in flowchart form a process for operating an oscillator circuit according to some embodiments.

FIG. 6 shows in flowchart form a process 600 for operating an oscillator circuit according to some embodiments. The depicted process 600 is suitable to be performed with an oscillator circuit such as oscillator circuit 100 of FIG. 1, or other suitable circuit implementations. Process 600 begins at block 602 where a plurality of VCO phase signals are provided from a PLL operating at a PLL frequency. Next, at block 604, a combination of multiple ones of the VCO phase signals is selected based on a control signal. In various embodiments, the control signal originates from an enable pattern generator or other suitable control circuitry for controlling a clock divider to achieve a desired clock frequency.

Based on the selected VCO phase signals, block 606 includes producing a first stage clock signal at an adjustable frequency related to the PLL frequency. The first stage clock signal at some frequencies has a balanced duty cycle, while at other frequencies has an unbalanced duty cycle. For example, the implementation of FIG. 1 has a balanced duty cycle at frequencies that are related to the PLL frequency by even fractional divisions based on the number of VCO phase outputs, and an unbalanced duty cycle at frequencies that related by odd fractional divisions.

Next, at block 608, an enable signal is selectively produced to indicate that an unbalanced duty cycle is present. In some embodiments, the enable signal indicates that an odd fractional division of the PLL frequency is desired for the adjustable frequency, which results in an unbalanced duty cycle. The enable signal is typically provided by the same control circuitry providing the control signal. In other embodiments, the enable signal is provided from another source. For example, in one embodiment detection circuitry detects an unbalanced duty cycle in the first stage clock signal and, in response, provides the enable signal.

At block 610, if the enable signal is not present, process 600 goes to block 616, and if the enable signal is present process 600 goes to block 612. At block 616, in response to absence of the enable signal, a DCA circuit is operated in a first mode in which the first stage clock signal is reproduced at a second stage clock signal output. At block 612, in response to presence of the enable signal, the DCA circuit is operated in a second mode which adjusts the duty cycle of the first stage clock signal. As shown at block 614, the second mode adjusts a falling edge of the first stage clock signal to provide an even duty cycle. The resulting clock signal is fed to the second stage clock signal output.

Figure 7:
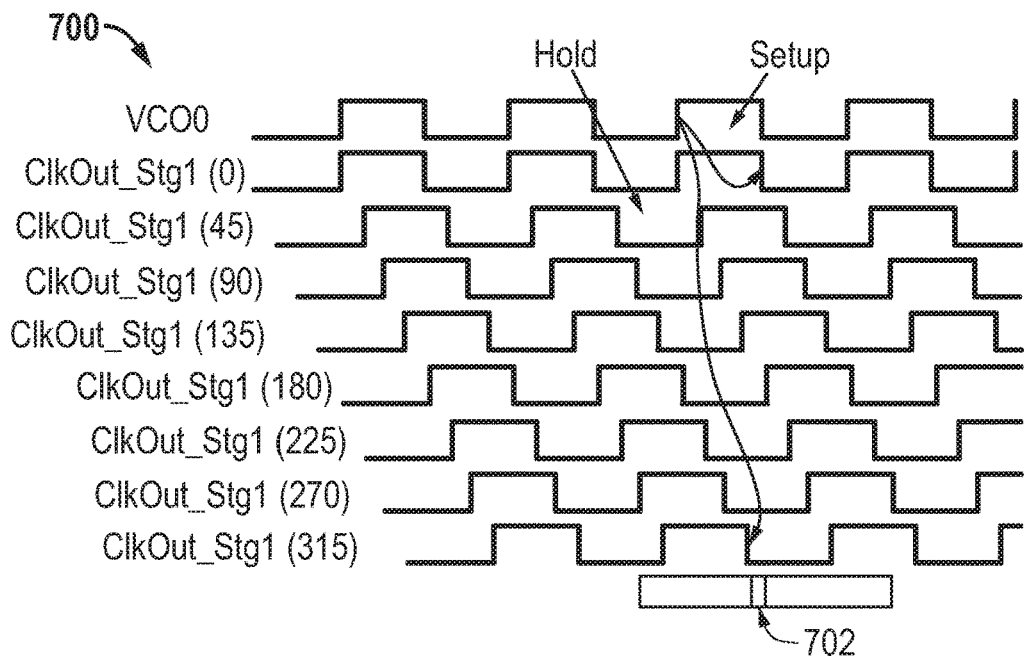
FIG. 7 is a timing diagram illustrating timing requirements for a DCA circuit enable signal according to some embodiments.

FIG. 7 is a timing diagram 700 illustrating timing requirements for a DCA circuit enable signal according to some embodiments. As discussed above with respect to FIG. 4, to enable DCA circuit 140 (FIG. 1) at the proper time in the clock cycle, enable signal 123 is required to be activated at a time after a previous falling edge of the first stage clock signal and before a falling edge adjustment is required. This requirement presents a challenge in enabling DCA circuit 140 with proper timing for all possible combinations of phase outputs. Depicted in timing diagram 700 are signals for eight VCO phase outputs, labelled "ClkOut_Stg1" with the phases listed in degrees from 0 degrees to 315 degrees in 45-degree increments, to illustrate the relationship of the falling edges. Assuming in this example that the falling edge of the 0 phase output is to be adjusted by DCA circuit 140, and any of the other depicted phase outputs may provide the previous falling edge, the time in which the enable signal 123 should go active is a small period 702 after the last falling edge of the latest phase output, ClkOut_Stg1 (315), and before the current falling edge of phase output ClkOut_Stg1 (0). As depicted by arrow marked "Hold", the prior value of the enable signal 123 should be held until the falling edge of the falling edge of ClkOut_Stg1 (315) is completed, and the available time for "Setup" to activate enable signal 123 is therefore reduced to a very small time. Therefore, generating an enable signal for all possible combinations of phase outputs requires very accurate timing within the enable signal generation circuit.

Figure 8:
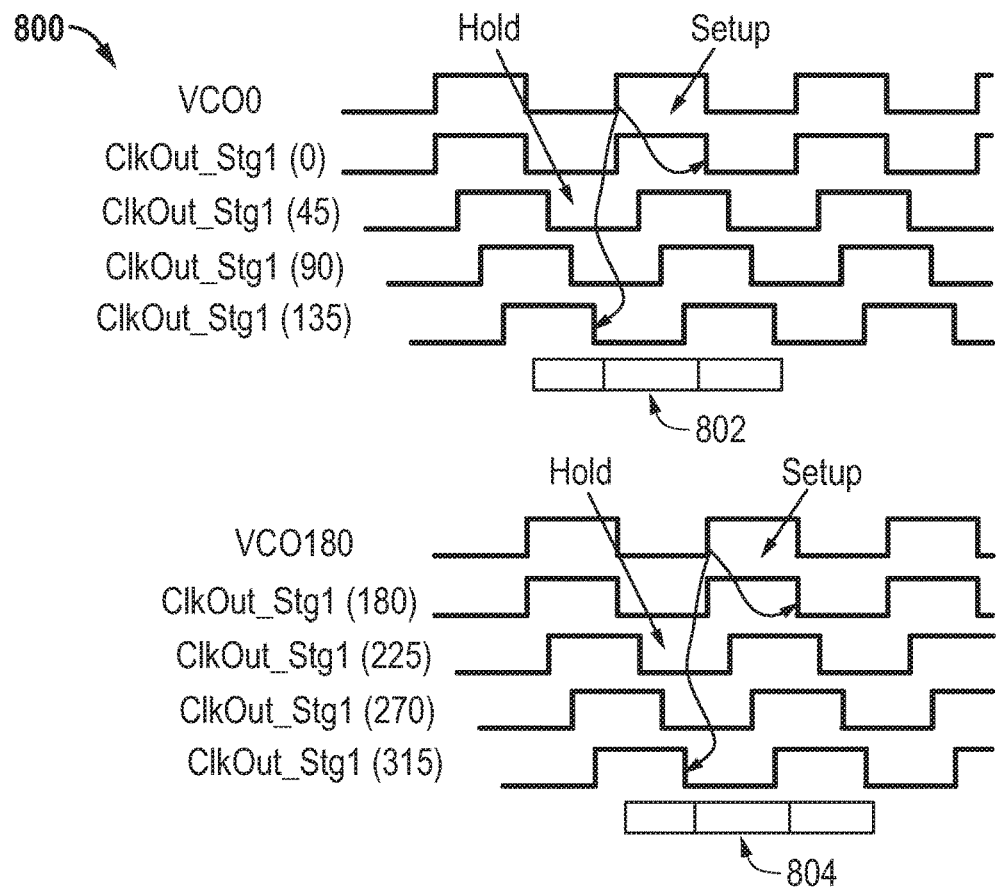
FIG. 8 is a timing diagram illustrating timing requirements for a DCA enable signal according to some other embodiments.

FIG. 8 is a timing diagram 800 illustrating timing requirements for a DCA enable signal according to some other embodiments. In this implementation, the enable pattern is employed in the enable signal generation process, providing the enable signal generation circuit knowledge of which phase outputs are used, and therefore allowing less stringent timing requirements for the enable signal generation. If the combination of phase outputs provided by enable pattern generator 120 (FIG. 1) uses one a first group of phase outputs, in this example phase outputs 0, 45, 90, and 135, to create the falling edge of the second stage clock signal, the upper depicted set of conditions applies and a time period 802 is available in which the enable signal can be activated. If the combination of phase outputs uses one of a second group of phase outputs to create the falling edge, in this example phase outputs 180, 225, 270, and 315, then the lower depicted conditions apply and a time period 804 is available in which the enable signal can be activated. As can be seen on the diagram, time periods 802 and 804 are much larger than time period 702 of FIG. 7, which allows for a simpler and more reliable enable signal generation process.

Figure 9:
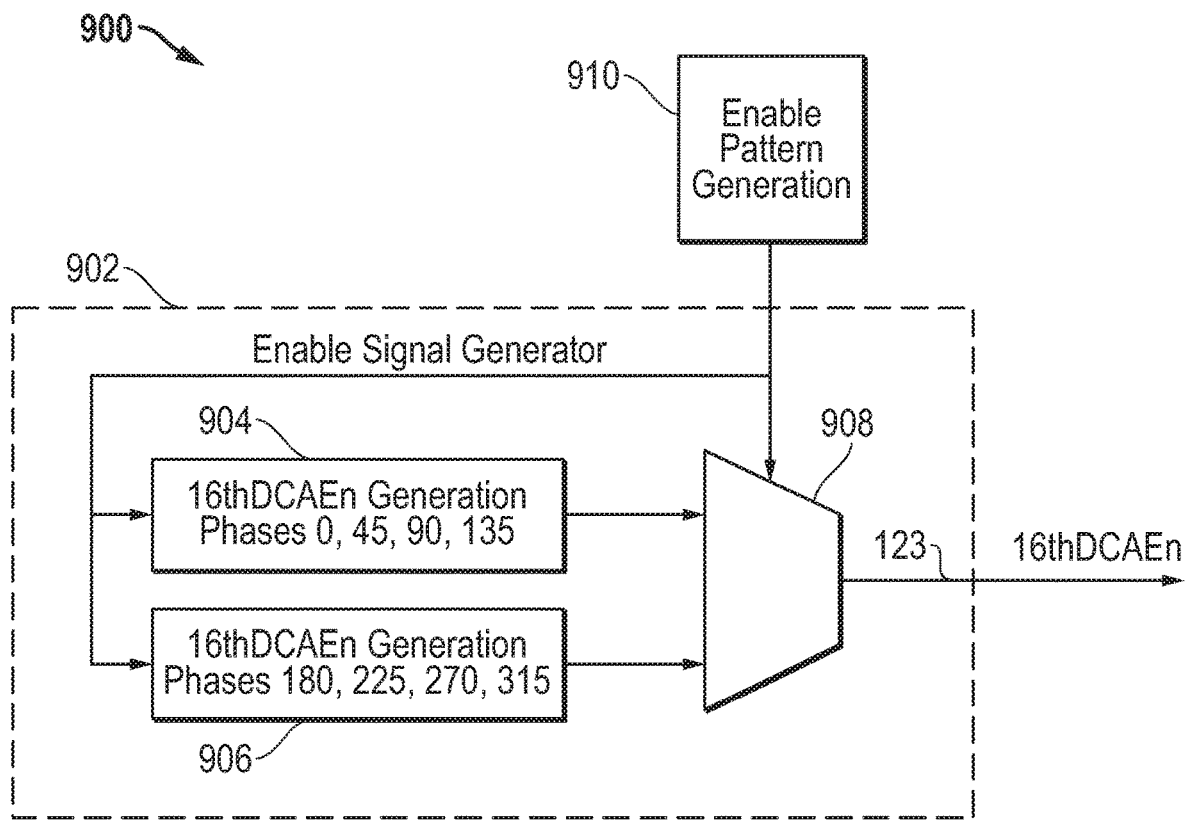
FIG. 9 illustrates in block diagram form an enable signal generation circuit according to some embodiments implementing the scheme depicted in FIG. 8.

FIG. 9 illustrates in block diagram form an enable signal generation circuit 900 according to some embodiments implementing the scheme depicted in FIG. 8. The depicted enable signal generation circuit 900 is part of enable pattern generator 120 (FIG. 1) in this example, providing enable signal 123 to DCA circuit 140. An enable signal generator 902 receives the current enable pattern from an enable pattern generation portion of the circuit, labelled 910. Two enable generation circuits 904 and 906 produce two different versions of an enable signal. Enable generation circuit 904 produces a first enable signal for a first group of phase outputs 0, 45, 90, and 135, based on the phase outputs and the enable pattern, which indicates whether the enable signal should be active. The first enable signal meets the timing requirements of time period 802. Enable generation circuit 906 produces a second enable signal for a second group of phase outputs 180, 225, 270, and 315. The second enable signal meets the timing requirements of time period 804. A selection circuit 908 selects one of the enable signals to pass through to output "16thDCAEn" based on the enable pattern which indicates the current combination of phase outputs used to produce the second stage clock signal. The selected signal provides the enable signal for DCA circuit 140.

Oscillator circuit 100 (FIG. 1), duty cycle adjustment circuit 200 (FIG. 2), and inverter 400 (FIG. 5) may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. While a particular design for enable signal generation circuit 900 is provided, many different circuit designs are suitable for meeting the timing requirements described herein. Furthermore, while DCA circuit 200 uses inverters with multiple branches to achieve the duty cycle adjustment functionality, many other circuits are suitable for adjusting the duty cycle to produce the second stage clock signal. Accordingly, it is intended by the appended claims to cover all modifications of the disclosed embodiments that fall within the scope of the disclosed embodiments.

What is claimed is:
1. An oscillator circuit comprising:
a phase-locked loop (PLL) having a PLL frequency and a plurality of voltage controlled oscillator (VCO) phase outputs;
a clock divider circuit receiving the VCO phase outputs from the PLL and producing a first stage clock signal at an adjustable frequency related to the PLL frequency and based on selecting a combination of multiple selected VCO phase outputs, the first stage clock signal having a balanced duty cycle at frequencies that are related to the PLL frequency by even fractional divisions of a VCO phase output period based on a number of the quantity VCO phase outputs, and an unbalanced duty cycle at frequencies that related by odd fractional divisions of the VCO clock period;
an enable pattern generator producing a control signal fed to the clock divider circuit and an enable signal indicating an odd fractional division of the PLL frequency is desired; and
a duty cycle adjustment (DCA) circuit receiving the first stage clock signal and the enable signal, and in response to a first value of the enable signal, operates in a first mode which reproduces the first stage clock signal at a second stage clock signal output, and in response to a second value of the enable signal, operates in a second mode which adjusts a falling edge of the first stage clock signal to provide an even duty cycle and feeds a resulting signal to the second stage clock signal output.

2. The oscillator circuit of claim 1, wherein the DCA circuit includes a programmable delay circuit with a plurality of branches which are programmable to adjust a phase delay of first stage clock signal falling edge to a desired phase delay.

3. The oscillator circuit of claim 2, wherein the branches are programmable with respective fuses which disable respective ones of the branches.

4. The oscillator circuit of claim 1, wherein the enable pattern generator includes a timing circuit operable to initialize the enable signal at a time after a previous falling edge of the first stage clock signal and before a falling edge adjustment is required.

5. The oscillator circuit of claim 4, wherein the timing circuit operates to initialize the enable signal under all odd fractional divisions of the PLL frequency possible using respective combinations of the VCO phase outputs.

6. The oscillator circuit of claim 4, wherein the timing circuit includes a first enable signal generation circuit generating a first enable signal suitable for a first set of phase outputs, a second enable signal generation circuit generating a second enable signal for a second set of phase outputs, and a selection circuit selecting one of the first or second enable signals to pass as the enable signal to the DCA circuit.

7. The oscillator circuit of claim 1, wherein the DCA circuit includes an inverted clock signal path including an input receiving an inverted first stage clock signal coupled to an input of a NOR gate, a second input of the NOR gate receiving an inverted version of the enable signal, an output of the NOR gate coupled to an inverter including multiple programmable branches, an output of the inverter coupled to an input of a second NAND gate with another input of the second NAND gate receiving the inverted first stage clock signal, and an output of the second NAND gate coupled to the second stage clock signal output.

8. The oscillator circuit of claim 1, wherein:
the PLL includes at least eight VCO phase outputs; and
the PLL provides VCO phase outputs at the PLL frequency in a range having a high end of at least four gigahertz.

9. A method comprising:
providing a plurality of voltage controlled oscillator (VCO) phase signals from a phase-locked loop (PLL) operating at a PLL frequency;
based on a control signal, selecting a combination of multiple selected VCO phase signals;
based on the selected VCO phase signals, producing a first stage clock signal at an adjustable frequency related to the PLL frequency, the first stage clock signal having a balanced duty cycle at frequencies that are related to the PLL frequency by even fractional divisions of a VCO phase output period based on the quantity of VCO phase outputs, and an unbalanced duty cycle at frequencies that are related by odd fractional divisions of the VCO phase output period;
producing an enable signal indicating when an odd fractional division of the PLL frequency is desired for the adjustable frequency;
in response to a first value of the enable signal, reproducing the first stage clock signal at a second stage clock signal output; and
in response to a second value of the enable signal, adjusting a falling edge of the first stage clock signal to provide an even duty cycle and feeding a resulting signal to the second stage clock signal output.

10. The method of claim 9, further comprising programming selected branches of a plurality of branches to achieve a desired phase delay in a programmable delay circuit which performs the first stage clock signal falling edge adjustment.

11. The method of claim 10, wherein the branches are programmed with respective fuses which disable respective ones of the branches.

12. The method of claim 10, wherein programming the branches includes:
measuring a characteristic of transistor devices within the branches, and
based on the measured characteristic, selecting one or more of the branches to disable to achieve the desired phase delay.

13. The method of claim 9, wherein producing the enable signal comprises initializing the enable signal with a timing circuit at a time after a previous falling edge of the first stage clock signal and before a falling edge adjustment is required.

14. The method of claim 13, wherein the timing circuit operates to initialize the enable signal under all odd fractional divisions of the PLL frequency possible using respective combinations of the VCO phase outputs.

15. The method of claim 9, wherein:
at least eight VCO phase outputs are provided; and
the PLL frequency operates in a range having a high end of least four gigahertz.

16. A duty cycle adjustment (DCA) circuit for an adjustable oscillator, comprising:
a first stage clock signal input operable for receiving a first stage clock signal at an adjustable frequency, the first stage clock signal having a balanced duty cycle at frequencies in a first group of selected frequencies, and an unbalanced duty cycle at frequencies in a second group of selected frequencies;
an enable signal input operable for receiving an enable signal indicating when the first stage clock signal has an unbalanced duty cycle;
a second stage clock signal output;
a timing adjustment circuit that, in response to a first value of the enable signal, operates in a first mode which reproduces the first stage clock signal at the second stage clock signal output, and, in response to a second value of the enable signal, operates in a second mode which adjusts a falling edge of the first stage clock signal to provide an even duty cycle and feeds a resulting signal to the second stage clock signal output; and
a programmable delay circuit with a plurality of branches which are programmable to adjust a phase delay of the first stage clock signal falling edge to a desired phase delay.

17. The DCA circuit of claim 16, wherein the branches are programmable with respective fuses which disable respective ones of the branches.

18. The DCA circuit of claim 16, further comprising a NAND gate receiving the first stage clock signal and the enable signal at its inputs, and an output coupled to an inverter including multiple programmable branches, an inverter output coupled to an input of a NOR gate, with another input of the NOR gate receiving the first stage clock signal and the output of the NOR gate coupled to an inverted second stage clock signal output.

19. The DCA circuit of claim 16, further comprising an inverted clock signal path including an input receiving an inverted first stage clock signal coupled to an input of a NOR gate, a second input of the NOR gate receiving an inverted version of the enable signal, an output of the NOR gate coupled to a second inverter including multiple programmable branches, an output of the second inverter coupled to an input of a second NAND gate with another input of the second NAND gate receiving the inverted first stage clock signal, and an output of the second NAND gate coupled to the second stage clock signal output.

\* \* \* \* \*